United States Patent [19]
Maguire et al.

[11] Patent Number: 5,604,454
[45] Date of Patent: Feb. 18, 1997

[54] INTEGRATED CIRCUIT WITH LOW OUTPUT BUFFER ENERGY CONSUMPTION AND RELATED METHOD

[75] Inventors: Jeffrey E. Maguire, Munich, Germany; Meng-Bing Yu, Austin, Tex.

[73] Assignee: Motorola Inc., Schaumburg, Ill.

[21] Appl. No.: 536,541

[22] Filed: Sep. 29, 1995

[51] Int. Cl.$^6$ .................................................. H03B 1/00
[52] U.S. Cl. ........................... 327/112; 327/108; 327/86; 326/86
[58] Field of Search .................... 326/33, 56, 57, 326/58, 86; 327/108, 365, 109, 110, 111, 112

[56] References Cited

PUBLICATIONS

Hahm, Mark, "Modest Power Savings for Applications Dominated by Switching of Large Capacitative Loads," 1994 IEEE Symposium on Low Power Electronics, pp. 60–61.

Primary Examiner—Timothy P. Callahan
Assistant Examiner—Jeffrey Zweizig
Attorney, Agent, or Firm—Paul J. Polansky

[57] ABSTRACT

An integrated circuit (20) includes multiple output buffers (30, 50, 70) which switch substantially simultaneously. The output buffers (30, 50, 70) are connected together via a common node (25). Before any one of the output buffers (30, 50, 70) actively drives its corresponding output node to an appropriate logic state, a coupling circuit (42) in the output buffer (30) evaluates whether the new logic state matches the old logic state. If the coupling circuit (42) determines that the logic states are different, then it couples the output node to the common node (25). With each output buffer in the group of multiple output buffers (30, 50, 70) functioning similarly, energy is conserved by using the charge stored in the low-going nodes to charge up the high-going nodes.

13 Claims, 2 Drawing Sheets

INTEGRATED CIRCUIT WITH LOW OUTPUT BUFFER ENERGY CONSUMPTION AND RELATED METHOD

FIELD OF THE INVENTION

This invention relates generally to electrical circuits, and more particularly, to energy conservation techniques for output buffer circuits of integrated circuits.

BACKGROUND OF THE INVENTION

Digital integrated circuits such as microprocessors have output and input/output signal lines for such functions as address, data, and control signals. Each output or input/output signal line has an output buffer associated with it which is used to drive a corresponding signal to an appropriate logic level. In general, it is desirable for output buffers to be fast, to have low switching noise, to be compact, and to have low power consumption.

Each integrated circuit output, input, or input/output signal line is typically routed on a printed circuit board to other integrated circuit components. The metal conductors which route the signals between the integrated circuits can be modeled as capacitors which must be charged or discharged to the appropriate logic levels. Because the capacitive loading of these signal lines is relatively large compared to the loading within the integrated circuit, buffer switching accounts for a significant portion of the energy consumption of the integrated circuit. As integrated circuit geometries continue to shrink, internal loading also decreases but board-level loading stays relatively constant. Thus, the portion of integrated circuit energy consumption due to external loading as a share of overall energy consumption increases. While many output buffer circuit design techniques have already addressed the speed and switching noise problems, new techniques to reduce power consumption are needed.

Much energy is consumed in the integrated circuit because the output buffers continually charge and discharge the large board capacitance. When an output buffer drives the signal line to a logic high voltage, charge is transferred from the more positive power supply voltage terminal, designated "$V_{DD}$", to the board capacitor. When the output buffer next drives the signal line to a logic low voltage, the charge stored in the board capacitor is discharged to the more negative power supply voltage terminal, designated "$V_{SS}$", through the output buffer. Thus, the charge on the external capacitor is essentially "wasted".

Two circuit design techniques have attempted to overcome the problem of wasted charge. The first technique is known as the adiabatic computing technique. Adiabatic computing oscillates $V_{DD}$ between its normal voltage and a voltage close to ground. This technique reduces energy consumption by switching the state when $V_{DD}$ is at the low potential, thus minimizing the charge dumped to ground. However, this technique is difficult to implement. It requires an inductor-capacitor circuit to drive the $V_{DD}$ node, which in non-ideal circuits also includes parasitic resistance which undesirably damps the signal. The buffer circuit is also slow since the frequency of oscillation needs to be low.

The second technique is known as the switched capacitor technique. According to this technique, large on-chip capacitors ramp the output up and down slowly in a charge-coupling manner. However, the capacitors cannot be implemented compactly and the output buffer requires a large amount of integrated circuit area. It is also normally slow because several capacitors need to be switched to obtain a large power savings.

Thus, known charge-conserving output buffer schemes create other problems that make their use undesirable. What is needed is an integrated circuit output buffer design to reduce energy consumption which is relatively fast and compact. These needs are met by the integrated circuit of the present invention, whose features and advantages will be more clearly understood from the following detailed description taken in conjunction with the accompanying drawings.

DETAILED DESCRIPTION OF A PREFERRED EMBODIMENT

Figure 1:
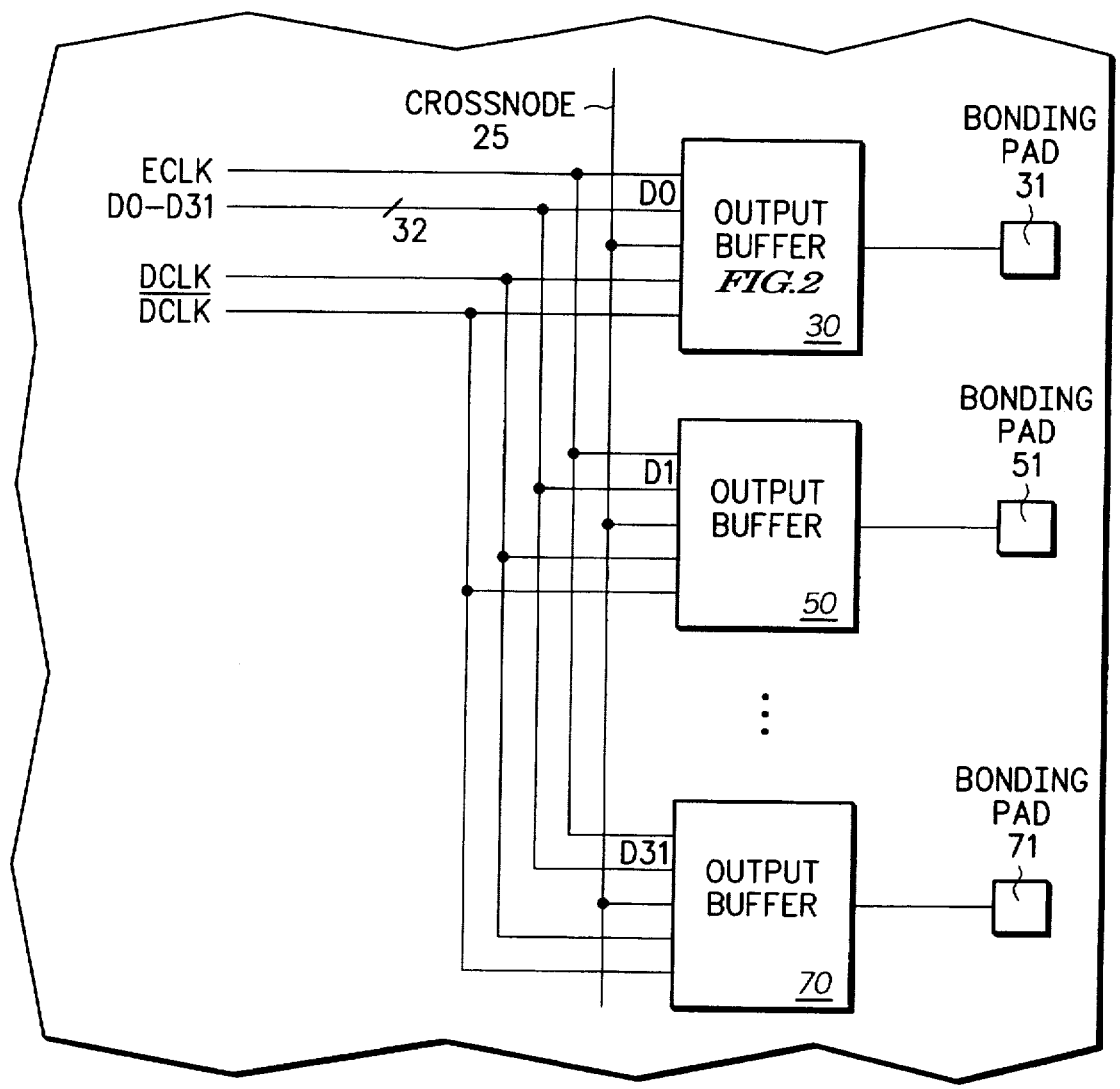
FIG. 1 illustrates in block diagram form a portion of an integrated circuit according to the present invention.

FIG. 1 illustrates in block diagram form a portion of an integrated circuit 20 according to the present invention. Integrated circuit 20 may be any type of digital integrated circuit which has multiple integrated circuit pins which are driven as outputs in synchronization. For example, integrated circuit 20 may be a microprocessor and the multiple integrated circuit pins may be, for example, data bus pins. Thus, as is illustrated in FIG. 1, integrated circuit 20 includes thirty-two output buffers forming a data bus. FIG. 1 illustrates exemplary output buffers 30, 50, and 70 connected to bonding pads 31, 51, and 71, respectively. Each output buffer is structurally identical except for receiving a different and corresponding one of the thirty-two data signals labelled "D0–D31". For example, output buffer 30 corresponds to and receives signal D0; output buffer 50 corresponds to and receives signal D1; and so on until a last output buffer 70 corresponds to and receives signal D31. The additional output buffers corresponding to data signals D2–D30 are present in integrated circuit 20 but are not shown.

Each output buffer also receives three clock signals to control its operation, labelled "ECLK", "DCLK", and "$\overline{DCLK}$", respectively. Signal DCLK, and its complement $\overline{DCLK}$, determine the point in time at which the output buffers become active to drive the bonding pads as determined by the logic levels on signals D0–D31.

In accordance with the invention, each output buffer receives an extra clocking signal, namely ECLK, and is connected to a common node which is connected across all output buffers and is labelled "CROSSNODE 25". Signal ECLK is active prior to the time during which signals DCLK and $\overline{DCLK}$ are active, but after D0–D31 have become valid. During this time, typically, some of the output buffers are switching to a logic high state and some are switching to a logic low state. CROSSNODE 25 reduces energy consumption by conserving the charge of the signals which were previously driven to a logic high level. This charge conservation results from the fact that statistically, it is very likely that other output signals will be simultaneously switching from a logic low state to a logic high state. Thus the output signal lines that are discharging are used to partially charge the output signal lines that are charging, and vice versa. Signal ECLK must be active in the first part of the cycle to cause this charge sharing prior to the point in time in which the buffers themselves become active to completely drive the output signals to the appropriate logic state. Preferably, signals ECLK and DCLK/$\overline{DCLK}$ are made non-overlapping with respect to each other, although a small amount of overlap can be tolerated. Furthermore, the data signals, D0–D31, must be active when signal ECLK is active so that the output buffers do not drive an invalid state onto their corresponding output terminals.

Figure 2:
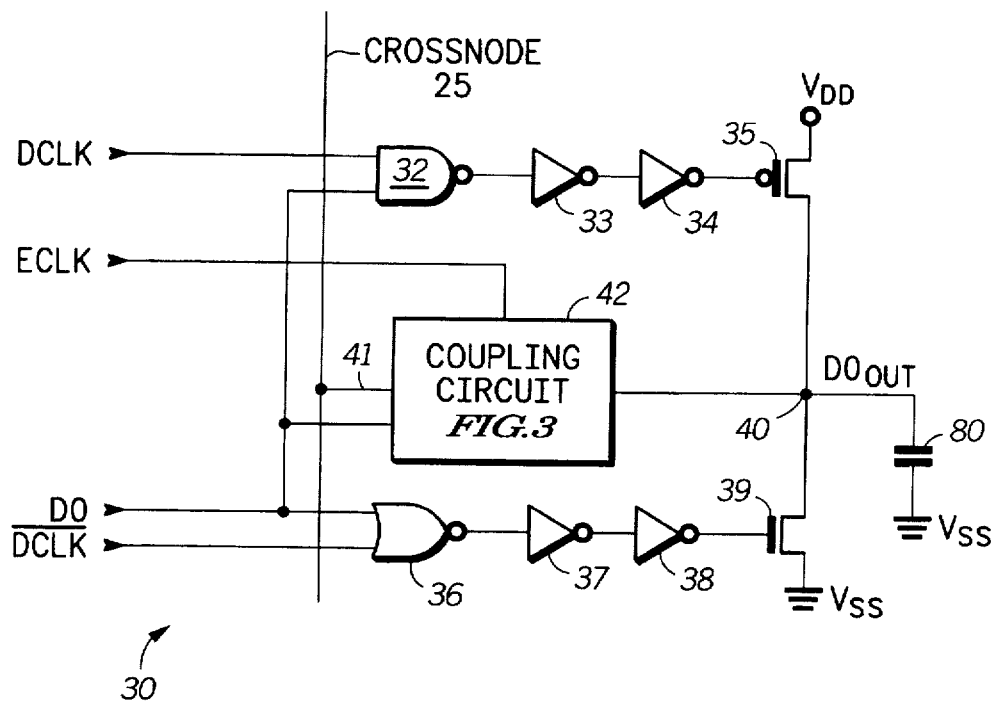
FIG. 2 illustrates in partial block, partial logic, and partial schematic form one of the output buffers of the integrated circuit of FIG. 1.

In the illustrated embodiment, each output buffer is structurally identical, and so may be understood by reference to FIG. 2, which illustrates in partial block, partial logic, and partial schematic form output buffer 30 of FIG. 1. From FIG. 2 it is seen that output buffer 30 includes a NAND gate 32, inverters 33 and 34, a P-channel metal-oxide-semiconductor (MOS) transistor 35, a NOR gate 36, inverters 37 and 38, an N-channel MOS transistor 39, a first node 40, and a second node 41. NAND gate 32 has a first input terminal for receiving signal DCLK, a second input terminal for receiving signal D0, and an output terminal. Inverter 33 has an input terminal connected to the output terminal of NAND gate 32, and an output terminal. Inverter 34 has an input terminal connected to the output terminal of inverter 33, and an output terminal. Transistor 35 has a source connected to a power supply voltage terminal labelled "$V_{DD}$", a gate connected to the output terminal of inverter 34, and a drain connected to node 40 which serves as an output terminal providing an output signal labelled "$D0_{OUT}$". $V_{DD}$ is a more positive power supply voltage terminal which has a nominal voltage of, for example, 3 volts. Together, NAND gate 32, inverters 33 and 34, and transistor 35 form a pullup portion of output buffer 30 which causes node 40 to be pulled up to $V_{DD}$ if signal D0 is at a logic high when signal DCLK is active.

NOR gate 36 has a first input terminal for receiving signal D0, a second input terminal for receiving signal $\overline{DCLK}$, and an output terminal. Inverter 37 has an input terminal connected to the output terminal of NOR gate 36, and an output terminal. Inverter 38 has an input terminal connected to the output terminal of inverter 37, and an output terminal. Transistor 39 has a drain connected to node 40, a gate connected to the output terminal of inverter 38, and a source connected to a power supply voltage terminal labelled "$V_{SS}$". $V_{SS}$ is a more negative or ground power supply voltage terminal which has a nominal voltage of approximately zero volts. Together, NOR gate 36, inverters 37 and 38, and transistor 39 form a pulldown portion of output buffer 30 which causes node 40 to be pulled down to $V_{SS}$ if signal D0 is at a logic low when signal $\overline{DCLK}$ is active.

Output buffer 30 also includes a coupling circuit 42. Coupling circuit 42 has a first terminal forming node 41 and connected to CROSSNODE 25, a data input terminal for receiving signal D0, a control input terminal for receiving signal ECLK, and a second terminal connected to output node 40. Also illustrated in FIG. 2 is a capacitor 80 having a first terminal connected through bonding pad 31 (not shown) to node 40, and a second terminal connected to $V_{SS}$. Capacitor 80 represents the parasitic capacitance inherent in the signal line conducting signal $D0_{OUT}$, caused by, for example, the proximity of the signal trace to a ground plane within the integrated circuit package and on the printed circuit board. Capacitor 80 typically has a value of the order of tens of picofarads (pF).

Coupling circuit 42 senses the condition, while the ECLK signal is active, in which signals D0 and $D0_{OUT}$ are in opposite logic states, which represents the condition in which buffer 30 will switch the logic state on node 40. In that case, coupling circuit 42 couples node 41 to node 40 while signal ECLK is active. This coupling action causes the charge built up in those signal lines which have been at a logic high level, to dump charge into CROSSNODE 25. This action not only partially discharges this node, but also partially charges the signals which are changing from a logic low to a logic high.

Figure 3:
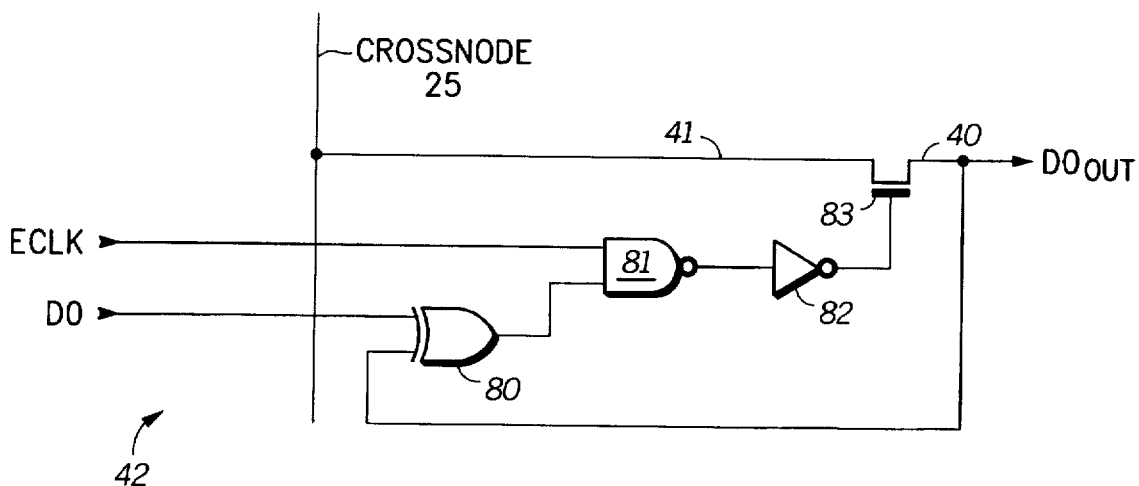
FIG. 3 illustrates in partial schematic and partial logic form the coupling circuit of FIG. 2.

FIG. 3 illustrates in partial schematic and partial logic form coupling circuit 42 of FIG. 2. Coupling circuit 42 includes an exclusive-OR gate 80, a NAND gate 81, an inverter 82, and an N-channel MOS transistor 83. Exclusive-OR gate 80 has a first input terminal for receiving signal D0, a second input terminal for receiving signal $D0_{OUT}$, and an output terminal. NAND gate 81 has a first input terminal for receiving signal ECLK, a second input terminal connected to the output terminal of exclusive-OR gate 80, and an output terminal. Inverter 82 has an input terminal connected to the output terminal of NAND gate 81, and an output terminal. Transistor 83 has a first source/drain terminal connected via node 41 of output buffer 30 to CROSSNODE 25, a gate connected to the output terminal of inverter 82, and a second source/drain terminal connected to node 40. Note that which terminal of transistor 83 functions as the source terminal and which terminal functions as the drain terminal depends on the voltages applied.

When the logic state present on node 40 is different that the logic state of signal D0, the output of exclusive-OR gate 80 is active at a logic high voltage. When signal ECLK is also active, the output of NAND gate 81 is a logic low voltage. Inverter 82 receives the logic low voltage on the output of NAND gate 81 and drives a logic high voltage onto the gate of transistor 83. This logic high voltage makes transistor 83 conductive, coupling node 40 to node 41. The direction of current flow depends on which node is at which logic level.

Considering FIGS. 1 and 2 together now, it should be appreciated that the improvement in energy consumption comes at the expense of somewhat slower switching. In many applications, such as those running off a battery, the value of the reduced energy consumption will greatly outweigh the loss in speed. It should also be noted that the reduction in energy conservation will vary from cycle to cycle depending on the number of signals switching to particular logic states, but that statistically, the improvement will be significant. This improvement is summarized by simulation data in TABLE I below:

TABLE I

| % of buffers switching to a logic high | New/Normal Rise Delay (%) | New/Normal Fall Delay (%) | Normal/New Energy (%) |
| --- | --- | --- | --- |
| 0 | — | +48.3 | −27.7 |
| 10 | −20.6 | +46.2 | +65.6 |
| 20 | −12.7 | +43.6 | +79.8 |
| 30 | +0.6 | +40.0 | +80.6 |
| 40 | +11.6 | +35.1 | +74.3 |
| 50 | +17.1 | +28.9 | +61.3 |
| 60 | +22.8 | +21.2 | +45.3 |
| 70 | +28.2 | +6.5 | +30.2 |
| 80 | +32.8 | −4.5 | +17.6 |
| 90 | +36.7 | −12.2 | +7.2 |
| 100 | +40.2 | — | −1.8 |

In TABLE I, the first column represents the percentage of buffers changing logic states that are switching to a logic high. The second (third) column represents the percentage increase or decrease in total rise (fall) time wherein the "New" time is computed by adding the output buffer switching time to the time during which signal ECLK is active. The fourth column represents the percentage increase in energy of a conventional buffer design compared to the present design. Thus, the greater reduction in energy to switch the logic states occurs when about half of the buffers are switching to a logic high. The actual energy reduction achieved in a particular application depends on the switching statistics of the buffers within that application.

It should be appreciated that coupling circuit 42 could accomplish the same result using different logic. However, it is preferable for transistor 83 to be N-channel because in conventional complementary MOS (CMOS) manufacturing processes, P-channel transistors must be sized approximately twice as large as N-channel transistors to have the same strength. CROSSNODE 25 is also preferably implemented in metal as opposed to polycrystalline silicon, in order to minimize resistance. Note that while the illustrated embodiment was CMOS, other types of transistors may be used. Specifically, transistor technologies which exhibit low steady-state (DC) current drain are the most appropriate for use with the present invention.

While the invention has been described in the context of a preferred embodiment, it will be apparent to those skilled in the art that the present invention may be modified in numerous ways and may assume many embodiments other than that specifically set out and described above. For example, an integrated circuit according to the present invention may perform any of a variety of functions such as microprocessor, microcontroller, memory, peripheral, and the like. Also, an output buffer according to the present invention is not limited to CMOS implementations but may use other transistor technologies. Furthermore, the pullup and pulldown portions of the output buffer shown in FIG. 2 are merely illustrative and different output buffers may be used. While data signals were illustrated, other signal types such as address signals, general-purpose input/output signals, etc. are also possible. The output buffers illustrated herein receive three separate clock signals; however, since signal ECLK precedes DCLK and signals DLCK and DCLK are complementary, it should be apparent that only a single clock input signal is required. In this case, the buffer itself may generate the other clock signal variants. Also note that if the buffer is an inverting buffer, the coupling circuit would couple the output terminal to the crossnode if the input and output signals are in the same logic state rather than in opposite logic states. Accordingly, it is intended by the appended claims to cover all modifications of the invention which fall within the true spirit and scope of the invention.

We claim:

1. An integrated circuit with low energy consumption comprising:

an internal node;

a plurality of output buffers providing output signals on a corresponding plurality of output nodes, and coupled together via said internal node, each of said plurality of output buffers comprising:

a first transistor having a first current electrode coupled to a first power supply voltage terminal, a control electrode for receiving a pullup signal, and a second current electrode coupled to an output terminal for providing an output signal thereon;

a second transistor having a first current electrode coupled to said output terminal, a control electrode for receiving a pulldown signal, and a second current electrode coupled to a second power supply voltage terminal;

a first predriver circuit responsive to a data signal of a plurality of data signals, for providing said pullup signal when said data signal is in a first logic state;

a second predriver circuit responsive to said data signal for providing said pulldown signal when said data signal is in a second logic state; and a coupling circuit having a first terminal coupled to said internal node, a second terminal coupled to said output terminal, and an input terminal for receiving said data signal, said coupling circuit being conductive to couple said internal node to said output terminal when a logic level of said output terminal is different from a logic level of said data signal.

2. The integrated circuit of claim 1 wherein said coupling circuit further has an enable input terminal for receiving a first clock signal, wherein said coupling circuit is conductive to couple said internal node to said output terminal only when both a logic level of said output terminal is different from a logic level of said data signal, and said first clock signal is active.

3. The integrated circuit of claim 2 wherein said coupling circuit comprises:

an exclusive OR gate having a first input terminal for receiving said data signal, a second input terminal coupled to said output terminal, and an output terminal;

a NAND gate having a first input terminal for receiving said first clock signal, a second input terminal coupled to said output terminal of said exclusive OR gate, and an output terminal;

an inverter having an input terminal coupled to said output terminal of said NAND gate, and an output terminal; and a third transistor having a first current electrode coupled to said internal node, a control electrode coupled to output terminal of said inverter, and a second current electrode coupled to said output terminal.

4. The integrated circuit of claim 3 wherein said third transistor is an N-channel metal-oxide-semiconductor (MOS) transistor.

5. The integrated circuit of claim 1 wherein said first transistor is a P-channel MOS transistor and wherein said second transistor is an N-channel MOS transistor.

6. The integrated circuit of claim 2 wherein said first and second predriver circuits are further active only when a second clock signal is active.

7. The integrated circuit of claim 6 wherein said first and second clock signals are characterized as being substantially nonoverlapping with respect to each other.

8. An integrated circuit with low output buffer energy consumption comprising:

a plurality of output buffers each providing an output signal on a corresponding output terminal responsive to a corresponding one of a plurality of data signals; and an internal node, each of said plurality of output buffers including coupling means for coupling said corresponding output terminal to said internal node if a logic state of a corresponding one of said plurality of data signals indicates that a logic state of said corresponding output terminal will change in response to said corresponding one said plurality of data signals.

9. The integrated circuit of claim 8 wherein said coupling means of each of said plurality of output buffers further couples said corresponding output terminal to said internal node only when a first clock signal is active.

10. The integrated circuit of claim 9 wherein said coupling means comprises:

an exclusive OR gate having a first input terminal for receiving said corresponding one of said plurality of data signals, a second input terminal coupled to said corresponding output terminal, and an output terminal;

a NAND gate having a first input terminal for receiving said first clock signal, a second input terminal coupled to said output terminal of said exclusive OR gate, and an output terminal;

an inverter having an input terminal coupled to said output terminal of said NAND gate, and an output terminal; and a transistor having a first current electrode coupled to said internal node, a control electrode coupled to said output terminal of said inverter, and a second current electrode coupled to said corresponding output terminal.

11. The integrated circuit of claim 9 wherein each of said plurality of output buffers further drives a voltage on said corresponding output terminal only when a second clock signal is active.

12. A method for reducing the energy consumption required by an integrated circuit to drive a plurality of output terminals to voltage levels representative of a plurality of data signals, comprising the steps of:

coupling to an internal node, during a first predetermined time period, each of said plurality of output terminals in which a corresponding one of said plurality of data signals indicates that a logic state thereof will change;

decoupling from said internal node at an end of said first predetermined time period each of said plurality of output terminals in which said corresponding one of said plurality of data signals indicates that said logic state thereof will change; and driving each of said plurality of output terminals to a voltage level indicated by a logic state of said corresponding one of said plurality of data signals, during a second predetermined time period.

13. The method of claim 12 wherein said step of driving further comprises the step of driving during said second predetermined time period which follows said end of said first predetermined time period.

* * * * *